United States Patent
Steinmann et al.

(10) Patent No.: US 12,489,097 B2
(45) Date of Patent: Dec. 2, 2025

(54) LIGHT EMITTING MODULE COMBINING ENHANCED SAFETY FEATURES AND THERMAL MANAGEMENT

(71) Applicant: ams Sensors Asia Pte. Ltd., Singapore (SG)

(72) Inventors: Lukas Steinmann, Singapore (SG); Hartmut Rudmann, Jona (CH); Mario Cesana, Au (CH); Camilla Camarri, Au (CH)

(73) Assignee: AMS SENSORS ASIA PTE. LTD., Singapore (SG)

( * ) Notice: Subject to any disclaimer, the term of this patent is extended or adjusted under 35 U.S.C. 154(b) by 1010 days.

(21) Appl. No.: 17/617,712

(22) PCT Filed: Jun. 25, 2020

(86) PCT No.: PCT/SG2020/050359
§ 371 (c)(1),
(2) Date: Dec. 9, 2021

(87) PCT Pub. No.: WO2020/263184
PCT Pub. Date: Dec. 30, 2020

(65) Prior Publication Data
US 2022/0236381 A1    Jul. 28, 2022

Related U.S. Application Data

(60) Provisional application No. 62/867,456, filed on Jun. 27, 2019.

(51) Int. Cl.
*H01L 25/16* (2023.01)
*G01S 7/481* (2006.01)
(Continued)

(52) U.S. Cl.
CPC .......... *H01L 25/167* (2013.01); *G01S 7/4813* (2013.01); *G01S 17/08* (2013.01);
(Continued)

(58) Field of Classification Search
CPC ..... H01L 25/167; G01S 7/4813; G01S 17/08; H01S 5/0206; H01S 5/042
See application file for complete search history.

(56) References Cited

U.S. PATENT DOCUMENTS

| 11,898,706 B2* | 2/2024 | Athalye | .................. F21K 9/232 |
| 2003/0002770 A1* | 1/2003 | Chakravorty | ............ G02B 6/42 385/14 |

(Continued)

FOREIGN PATENT DOCUMENTS

| CN | 102738090 A | 10/2012 |
| CN | 105992960 A | 10/2016 |

(Continued)

OTHER PUBLICATIONS

Chinese office action issued for the corresponding Chinese patent application No. 202080045789.6, dated Feb. 19, 2024, 10 pages (for informational purposes only).
(Continued)

*Primary Examiner* — Christopher E Dunay
(74) *Attorney, Agent, or Firm* — Viering, Jentschura & Partner mbB (57) ABSTRACT

An optical module (200) comprises an emitter (214) configured to emit electromagnetic radiation and a first substrate (212) configured to support the emitter (214). The optical module (200) further comprises a driver (220) configured to control the emitter (214) and a second substrate (216) configured to support the driver (220). The first substrate (212) has a greater thermal conductivity than the second substrate (216).

11 Claims, 4 Drawing Sheets

(51) Int. Cl.
  *G01S 17/08* (2006.01)
  *H01S 5/02* (2006.01)
  *H01S 5/042* (2006.01)
  *H01S 5/00* (2006.01)

(52) U.S. Cl.
  CPC ............ *H01S 5/0206* (2013.01); *H01S 5/042* (2013.01); *H01S 5/005* (2013.01)

(56) References Cited

U.S. PATENT DOCUMENTS

| | | |
|---|---|---|
| 2003/0075355 A1 | 4/2003 | Anderson et al. |
| 2006/0110110 A1 | 5/2006 | Yi et al. |
| 2012/0248977 A1 | 10/2012 | Ootorii |
| 2013/0163627 A1 | 6/2013 | Seurin et al. |
| 2015/0229912 A1 | 8/2015 | Masalkar et al. |
| 2015/0380897 A1 | 12/2015 | Canumalla et al. |
| 2016/0345423 A1 | 11/2016 | Pyper et al. |
| 2017/0353004 A1 | 12/2017 | Chen et al. |
| 2017/0365977 A1 | 12/2017 | Tamura et al. |
| 2018/0014373 A1 | 1/2018 | Song et al. |
| 2018/0128432 A1 | 5/2018 | Lang |
| 2018/0343735 A1 | 11/2018 | Helbig et al. |
| 2020/0185875 A1* | 6/2020 | Allouche .............. H01S 5/0428 |
| 2021/0080099 A1* | 3/2021 | Gielen ................ F21V 33/0032 |
| 2023/0027279 A1* | 1/2023 | Shi ...................... H01S 5/18388 |
| 2025/0085400 A1* | 3/2025 | Zhu ....................... G01S 17/894 |

FOREIGN PATENT DOCUMENTS

| | | |
|---|---|---|
| CN | 108933126 A | 12/2018 |
| EP | 2610978 A2 | 7/2013 |
| TW | 201335540 A | 9/2013 |
| TW | 201817280 A | 5/2018 |

OTHER PUBLICATIONS

German Office Action of corresponding German Patent Application No. 11 2020 003 103.9, dated Oct. 7, 2024, 8 pages (for informational purposes).

International Search Report for corresponding International Application No. PCT/SG2020/050359, dated Sep. 15, 2020.

Office Action of the corresponding Taiwanese Patent Application No. 109121957, dated Mar. 29, 2023, 9 pages.

Office Action of corresponding Chinese Patent Application No. 202080045789.6, dated Jul. 10, 2023, 9 pages.

* cited by examiner

LIGHT EMITTING MODULE COMBINING ENHANCED SAFETY FEATURES AND THERMAL MANAGEMENT

TECHNICAL FIELD OF THE DISCLOSURE

This disclosure relates to a compact optical module or light emitting package that combines efficient electrical connection routing and thermal management.

BACKGROUND OF THE DISCLOSURE

The present disclosure relates to an optical module, which may form part of an electronic device such as a mobile phone.

Figure 1:
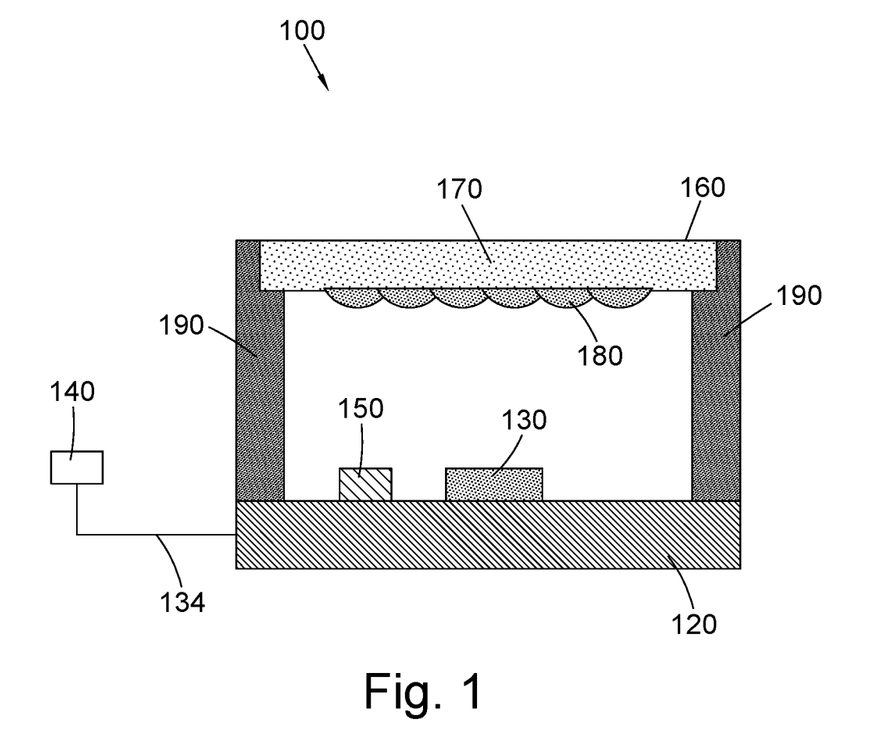
FIG. 1 schematically depicts a cross-sectional view of a known optical module.

An example of a known optical module 100 is illustrated in FIG. 1. The known optical module 100 may be referred to as a known light emitter package. The known optical module 100 comprises a printed circuit board 120 on which is mounted an emitter 130, and a detector 150. The emitter 130 is configured to emit electromagnetic radiation. A driver 140 that is separate to and located outside of the known optical module 100 is configured to control the emitter 130. The driver 140 is connected to the emitter 130 by wiring 134. The detector 150 is configured to detect electromagnetic radiation reflected from an optical assembly 160, which includes a transmissive carrier 170 for an optical element 180. Spacers 190 serve as lateral outer sidewalls of the known optical module 100 and define a separation distance between the printed circuit board 120 and the optical assembly 160.

If the structure of the known optical module 100 becomes compromised (e.g., the transmissive carrier 170 cracks) then a user's eyes and skin may be at risk of being damaged by the electromagnetic radiation emitted by the emitter 130. Another problem with the known optical module 100 is that inefficient electrical routing exists between different components (e.g. the driver 140 and the emitter 130). A further problem is that the known optical module 100 is not compact and may not be suitable for uses that require a more compact optical module (e.g. in a mobile electronic device, such as a mobile phone). The driver 140 is located outside the known optical module 100 at least partly to ease management of thermal energy produced by the components of the known optical module 100 during use. Overheating of components negatively affects a performance of the known optical module 100.

It is therefore an aim of the present disclosure to provide an optical module that address one or more of the problems above, or at least provides a useful alternative.

SUMMARY

According to one aspect of the present disclosure, there is provided an optical module comprising an emitter configured to emit electromagnetic radiation, a first substrate configured to support the emitter, a driver configured to control the emitter, and a second substrate configured to support the driver. The first substrate has a greater thermal conductivity than the second substrate.

The first substrate may be configured to provide thermal management (e.g. thermal transport and/or dissipation) for the emitter.

The material(s) and/or the structure(s) of the first substrate may be selected to improve an ability of the first substrate to conduct thermal energy away from the emitter during use of the optical module.

The second substrate may be configured to house electrical connections to the driver. The second substrate and the electrical connections may be considered to be separate entities. The thermal conductivity of the second substrate may be different to and separate from the thermal conductivity of the electrical connections. That is, the thermal conductivity of the second substrate may not include the thermal conductivity of the electrical connections.

The material(s) and/or structure(s) of the second substrate may be selected to improve an ability of the second substrate to house electrical connections for the driver.

The second substrate may house a greater number of electrical connections than the first substrate.

The first substrate may have a greater surface area than the second substrate.

Providing different substrates for mounting different components of the optical module advantageously allows each substrate to be optimized for different requirements. The first and second substrates may be tailored for different functions that allow thermal management and electrical routing functions to be decoupled from one another. This enables improved management of each function compared to known optical modules. The optical module according to the invention houses the driver and the emitter in a compact arrangement without compromising thermal energy management or electrical routing.

The components of the optical module are contained within a single light emitter package. That is, the driver is integrated into the light emitter package along with the emitter and the first and second substrates. In other words, the optical module enclosure that houses the emitter also houses the driver, the first substrate and the second substrate. This is in contrast to some known optical modules that involve disposing the driver outside of the light emitting package. By locating the driver inside of the light emitting package, the optical module is advantageously more compact than known optical modules.

The emitter may comprise a plurality of emitting elements. The plurality of emitting elements may be arranged in an array.

The emitter may comprise a vertical cavity surface emitting laser (VCSEL). The VCSEL may be a high power VCSEL, e.g. having a continuous wave optical power output of about 3 W or more.

The emitter may comprise a light emitting diode (LED).

The emitter may be configured to emit infrared light. The infrared light may have a wavelength of about 850 nm or more. The infrared light may have a wavelength of about 1400 nm or less.

The emitter may be configured to emit visible light.

The driver may comprise an integrated circuit.

The driver may comprise an integrated circuit chip.

The driver may be configured to convert a power supply to a level appropriate for the emitter. For example, the driver may receive a power supply from an external power source, convert the power supply into a pulsed current and provide the pulsed current to the emitter. The driver may provide the emitter with a power of about 2 W or more. The driver may provide the emitter with a power of about 8 W or less.

The driver may be electrically coupled to the emitter by wiring that passes through the second substrate. The wiring may travel along the first substrate to the emitter.

The first substrate may comprise a ceramic. The ceramic may comprise AlN. The ceramic may comprise AlO2

The first substrate may comprise a metallic frame. The metallic frame may be referred to as a lead frame. The metallic frame may comprise an alloy. The alloy may comprise iron and nickel. The alloy may comprise about 42% nickel. The metallic frame may comprise copper.

The second substrate may comprise an electrically insulating material configured to house a plurality of electrical connections. The electrically insulating material may comprise FR4.

The first and second substrates may be arranged in a stacked arrangement.

The stacked arrangement advantageously reduces an overall size of a footprint of the optical module, thereby making the optical module more compact than known optical modules. That is, the optical module has a smaller area and/or volume than known optical modules. The stacked arrangement advantageously utilizes vertical space within the optical module that otherwise goes to waste in known optical modules.

The first and second substrates may have parallel and vertically offset axes in the stacked arrangement. The first and second substrates may be located in two parallel planes in the stacked arrangement.

The stacked arrangement provides at least some overlap between the first and second substrates. The first and second substrates may overlap each other along an optical axis of the optical module. That is, the first substrate may occupy a first plane that is orthogonal to the optical axis of the optical module, and the second substrate may occupy a different plane that is orthogonal to the optical axis of the optical module. The stacked arrangement may provide complete overlap between the first and second substrates.

The second substrate may comprise an opening to accommodate the emitter.

The optical module may comprise an optical assembly configured to modify an optical characteristic of the electromagnetic radiation.

The optical assembly may comprise a transmissive (e.g., glass) carrier for supporting an optical element.

The optical element may comprise an optical structure operable to modify the optical characteristic of the light emitted by the light emitter.

The optical element may comprise a micro-lens array (MLA). The optical element may comprise an optical diffuser. The optical element may comprise a lens. The optical element may comprise a refractive or diffractive optical element. The optical element may comprise a diffuser. The optical element may comprise a spectral filter. The optical element may comprise a polarizing filter The optical assembly may comprise an electrically conductive structure electrically coupled to the driver. The driver may be configured to monitor an electrical characteristic of the electrically conductive structure.

The electrical characteristic may be a resistance of the electrically conductive structure.

The electrical characteristic may be a capacitance of the electrically conductive structure.

In the event such monitoring indicates the integrity of the optical module is (or may be) compromised, the driver can turn off or otherwise regulate the output of the emitter to ensure eye and skin safety of a user of the optical module.

The driver may be electrically coupled to the electrically conductive structure by wiring.

The driver may be configured to regulate an optical output of the emitter if the electrical characteristic of the electrically conductive structure changes by more than a pre-determined amount.

If the monitored characteristic is resistance, then the pre-determined amount may be an open circuit resistance. That is, the circuit may be broken when the optical module is structurally compromised, thereby creating an open circuit with an effectively infinite resistance.

If the monitored characteristic is capacitance, then the pre-determined amount may be a change of about ±50% of an operating capacitance of the electrically conductive structure.

The driver may be configured to stop the optical output of the emitter if the electrical characteristic of the electrically conductive structure changes by more than the pre-determined amount.

The electrically conductive structure and the emitter may be arranged such that the electromagnetic radiation is at least partially incident on the electrically conductive structure. The electrically conductive structure may be substantially transparent to the electromagnetic radiation. Substantially transparent may be defined as about 90% transmission or more.

The electrically conductive structure may comprise Indium Tin Oxide.

The optical path of the electromagnetic radiation may be referred to as an optical footprint. The electrically conductive structure may be located at least partially inside the optical path of the light emitted by the emitter.

The electrically conductive structure and the emitter may be arranged such that the electromagnetic radiation is not incident on the electrically conductive structure. The electrically conductive structure may be substantially opaque to the electromagnetic radiation. Substantially transparent may be defined as about 5% transmission or less.

The electrically conductive structure may be located outside of an optical path of the electromagnetic radiation.

The electrically conductive structure may comprise chrome.

The optical module may comprise a spacer configured to define a separation distance between the second substrate and the optical assembly. The spacer may comprise a plastic. The spacer may comprise a liquid crystal polymer plastic.

The optical module may comprise a detector. The second substrate may be configured to support the detector.

The detector may comprise a photodiode.

The detector may be configured to detect electromagnetic radiation that is reflected by the optical assembly.

The detector may be configured to detect electromagnetic radiation that has been emitted by the emitter, travelled out of the optical module, reflected from an object and travelled back into the optical module and onto the detector. The emitter and the detector may form part of a time-of-flight sensor. The optical module may comprise the time-of-flight sensor.

According to another aspect of the present disclosure, there is provided an electronic device comprising the optical module of any preceding aspect.

The electronic device may be portable. The electronic device may be a mobile phone.

It is particularly advantageous to utilize the optical module in a mobile device because mobile devices tend to be more compact than comparable non-mobile devices. As such, incorporating a compact optical module having improved electrical routing and improved thermal management provides a particularly advantageous solution for mobile devices.

The electronic device may be a telecommunications system. The electronic device may be a computing device such as a mobile phone or a tablet computer. The electronic device may be a medical device such as a diagnostics device.

According to another aspect of the present disclosure, there is provided a method of manufacturing an optical module comprising providing a first substrate, attaching an emitter to the first substrate, providing a second substrate having a thermal conductivity that is less than a thermal conductivity of the first substrate, and attaching a driver to the second substrate, the driver being configured to control the emitter.

The first substrate may comprise a ceramic.

The first substrate may comprise a metallic frame.

The second substrate may comprise an electrically insulating material configured to house a plurality of electrical connections.

The method may comprise arranging the first and second substrates in a stacked arrangement.

The method may comprise providing an opening in the second substrate and accommodating the emitter within the opening.

The method may comprise providing an optical assembly configured to modify an optical characteristic of electromagnetic radiation emitted by the emitter.

The method may comprise providing the optical assembly with an electrically conductive structure and electrically coupling the electrically conductive structure to the driver.

BRIEF DESCRIPTION OF THE PREFERRED EMBODIMENTS

Some embodiments of the disclosure will now be described by way of example only and with reference to the accompanying drawings, in which.

DETAILED DESCRIPTION OF THE PREFERRED EMBODIMENTS

New features are being added to smart phones, tablets and other portable computing devices that include technologies to record three dimensional images, sense motion and/or gestures. Digital recording methods use various types of miniature illuminators, which interact with cameras to record dynamical events in three-dimensional regions. These illuminators can be of various forms and deliver different types of functions. Some illuminate a wide area with very short pulses for Light Detection and Ranging (LIDAR) type measurements recording time of flight information and hence deriving three-dimensional scene information. Other illuminators are pulsed or continuous wave (CW), and project structured light patterns onto a scene. The digital camera records an image of the structured light pattern, and software algorithms are used to determine three-dimensional scene information from modifications in the patterned image.

One light emitting technology that is suitable for miniature illuminators is high power vertical cavity surface emitting laser (VCSEL) devices and array devices. These devices can be pulsed with very fast rise times suitable for time-of-flight applications. They are small, but produce high power laser beams with efficient electro-optic conversion. Various optical components (e.g., an optical diffuser) can be placed in the beam path to modify the beam properties for specific applications.

The optical output power of a bare VCSEL typically can, in some cases, be so high that it may cause damage to a user's eye or skin in the event the quality of the optical component is compromised. Thus, it is important to ensure that the high power laser illuminators meet laser safety regulations, particularly when operated in the portable computing devices. For example, the illuminator may be part of an assembly that, under normal operating conditions, maintains eye-safe operation by preventing a user from getting too close to the illuminator. However, in some cases, damage (e.g., cracks) to the optical structure that modifies the output beam for safe operation, and/or the presence of moisture or chemical contamination on the optical structure, may result in safety hazards. Likewise, if the optical structure were to fall off or be removed, a user's safety could be compromised.

To facilitate detecting mechanical defects (e.g., a crack) or the presence of moisture in an optical package, an electrically conductive structure (e.g., an electrically conductive trace) can be provided on a surface of a transmissive cover (e.g., a glass substrate) disposed over the emitter. In some cases, the electrically conductive structure is composed of a material (e.g., indium tin oxide (ITO)) that is substantially transparent to the wavelength of light produced by the emitter (e.g., infra-red). Such electrically conductive structures thus can at least partially overlap a footprint of an optical beam emitted by the emitter. On the other hand, in some instances, the electrically conductive structure is composed of a material (e.g., chrome) that is substantially opaque to the wavelength of light produced by the emitter. In such cases, the electrically conductive structure preferably does not overlap a footprint of an optical beam emitted by the emitter.

The electrically conductive structure can be coupled electrically to a controller (e.g., a driver for the emitter) that is operable to monitor an electrical characteristic (e.g., resistance or capacitance) of the electrically conductive structure such that if the monitored characteristic changes by more than a predetermined amount, the controller regulates an optical output produced by the emitter. In some implementations, the controller is operable to monitor the electrical characteristic of the electrically conductive structure such that if the monitored characteristic changes by more than a respective predetermined amount, the controller causes the optical output produced by the emitter to be stopped. For example, the driver can turn off the VCSEL so that it no longer emits light.

If the driver is disposed outside the light emitter package (as is the case with the known optical module 100 of FIG. 1), then the package can be tailored for thermal management and electrical contacts of the VCSEL or other emitter. However, for some applications, it is desirable to integrate the driver into the package. In such cases, a greater number of functions and more electrical routing must be managed within the package.

The present disclosure describes an approach for providing on-board eye-safety features, making the package more compact and improving electrical routing while maintaining thermal management of the VCSEL or other emitter. Thus, the present disclosure describes techniques for helping optimize thermal transport and dissipation, as well as electrical routing.

The present disclosure describes an optical module, illuminator or other light emitting package that includes a plurality of substrates, each of which can be optimized for different requirements. The plurality of substrates may be arranged in a stacked arrangement to reduce a width and/or length of the optical module. In particular, a first substrate in the stack can be optimized to provide good thermal management for the VCSEL or other emitter (e.g. a light emitting diode (LED)). A second substrate in the stack may be configured to house a high density routing of electrical connections (e.g. to provide electrical connections between the driver and the emitter and/or an electrically conductive structure). In this manner, the electrical routing and thermal management functions can be decoupled from one another. Further, by stacking the substrates one over the other, a relatively small overall footprint for the package (e.g. an area of the optical module) can be obtained.

Figure 2:
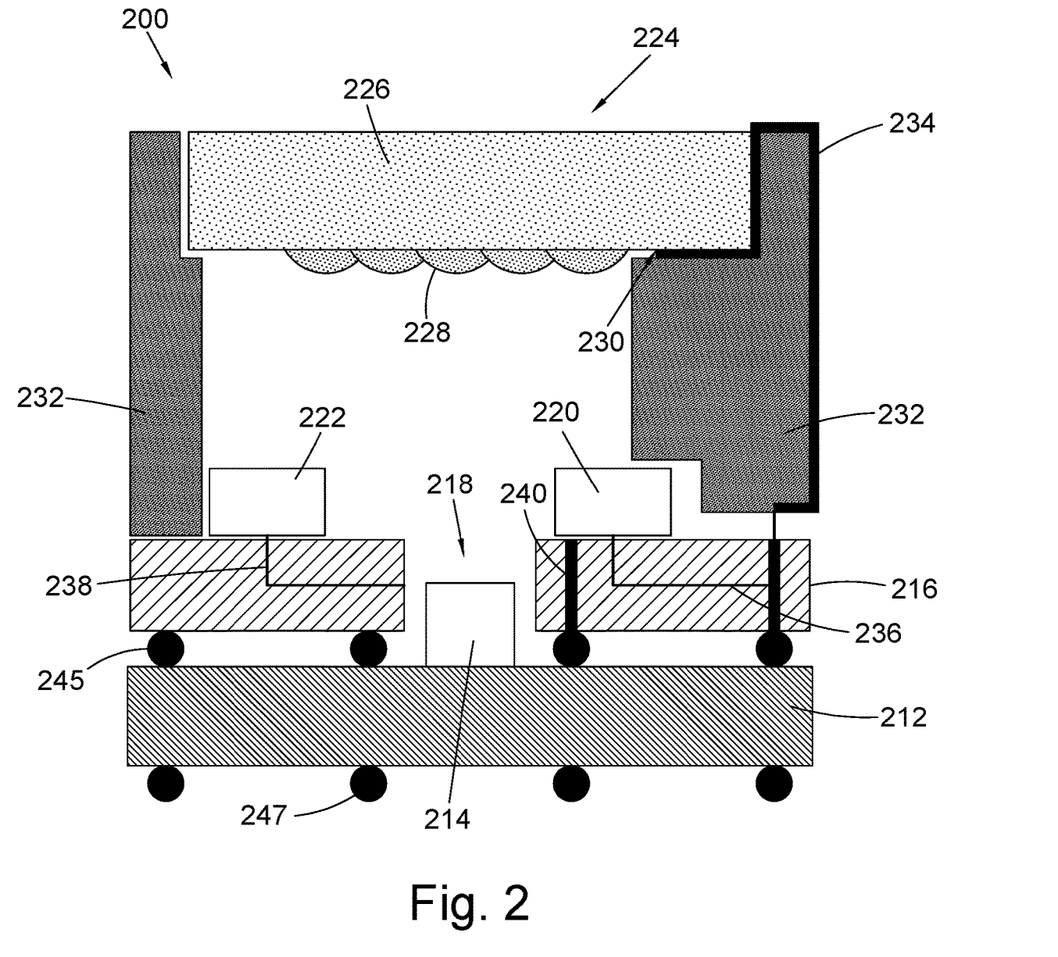
FIG. 2 schematically depicts a cross-sectional view of an optical module according to an aspect of the present disclosure.

As shown in FIG. 2, an optical module 200 includes a first substrate 212 (e.g., a lead frame (i.e. a metallic frame) or ceramic substrate) on which is mounted an emitter 214 (e.g., a VCSEL or LED). A second substrate 216 (e.g., an electrically insulating material, such as FR4) is stacked over the first substrate 212. The second substrate 216 comprises an opening 218 to accommodate the emitter 214 in a stacked arrangement thereby advantageously reducing a size of the optical module 200.

A driver 220 and a detector 222 (e.g., photodiode) are mounted on the second substrate 216. The second substrate 216 may house a plurality of electrical connections 238, 236. The plurality of electrical connections may comprise multiple embedded layers of Copper routing (not shown).

The driver 220 may be referred to as a processor. The driver 220, which can be implemented for example, as an integrated circuit (IC) chip, is configured to convert an external power supply (not shown) to a level appropriate for the VCSEL or other emitter 214. For example, the driver 220 may be configured to receive an input voltage and convert the input voltage to a laser pulse train for controlling the VCSEL or other emitter 214.

The detector 222 may be used, for example, to detect back reflectance from an optical assembly 224. The optical assembly 224 may include a transmissive (e.g., glass) carrier 226 for supporting an optical element 228. The optical element 228 may comprise, for example, a micro-lens array (MLA), an optical diffuser, a lens, a refractive or diffractive optical element, a diffuser, a spectral filter, a polarizing filter, and/or some other optical structure operable to modify the optical characteristics of the light emitted by the emitter 214 (e.g. a VCSEL output beam).

In the example of FIG. 2, the glass carrier 226 supports an electrically conductive structure 230 on the surface facing the VCSEL 214. In some embodiments, there may be an electrically conductive structure on the outward-facing surface of the glass carrier 226 in addition to, or instead of, the electrically conductive structure 230. The electrically conductive structure 230 may comprise, for example, an Indium Tin Oxide (ITO) trace.

In the example of FIG. 2, spacers 232 serve as lateral outer sidewalls of the optical module 210. The spacers 232 may define a separation distance between the second substrate 216 and the optical assembly 224. The separation distance may be selected in at least partial dependence on a divergence of the electromagnetic radiation emitted by the emitter 214 and/or a desired illumination (e.g. substantially uniform illumination) of the optical element 228. The separation distance may be about 0.5 mm or more. The separation distance may be about 1.0 mm or less. The spacers 232 may comprise, for example, a liquid crystal polymer (LCP) plastic 232.

The electrically conductive structure 230 is electrically coupled (e.g. by wiring 234) to the driver 220. The driver 220 is electrically coupled (e.g. by vias 236 (i.e. a metallic connection) and circuitry (not shown) in the printed circuit board 212) to the emitter 214. The driver 220 thus is operable to monitor a characteristic (e.g., a resistance and/or a capacitance) of the electrically conductive structure 230. In the event such monitoring indicates the integrity of the optical assembly 224 is (or may be) compromised (e.g., because of a crack in the transmissive carrier 226), the driver 220 can turn off or otherwise regulate an optical output of the emitter 214. This feature advantageously provides greater safety for a user because if the optical module 200 becomes compromised, the driver 220 can prevent the emitter 214 from emitting stray electromagnetic radiation that may otherwise damage a user's eyes and/or skin.

The specific material and structure of the first substrate 212, on which is mounted the light emitting 214, can be selected for thermal management (e.g., thermal transport and dissipation). On the other hand, the specific material and structure of the second substrate 216 can be selected for routing electrical connections for the driver 220, the detector 222, and/or other components (not shown) that may be mounted on the second substrate 216.

As explained above, providing different substrates 212, 216 for mounting the various components of the optical module 200 allows each substrate 212, 216 to be optimized for different requirements. Stacking the substrates 212, 216 one over the other can help reduce the overall footprint (e.g. area) of the optical module 200, thereby allowing the optical module 200 to be incorporated into smaller devices (e.g. a mobile phone).

The emitter 214 generates thermal energy when in use. The emitter 214 may become damaged, less efficient or non-operational if the emitter 214 becomes too hot. For example, a conversion efficiency of the emitter 214 (i.e. the energy supplied to the emitter 214 compared to the energy of electromagnetic radiation emitted by the emitter 214) may decrease as the temperature of the emitter 214 increases. The first substrate 212 is configured to conduct the thermal energy away from the emitter 214. That is, the first substrate 212 acts as a heat sink for the thermal energy generated by the emitter 214. The first substrate 212 thereby assists in preventing the emitter 214 from becoming too hot, which in turn improves an efficiency of the emitter 214 and reduces the risk of the emitter 214 becoming damaged.

The driver 220 is located inside the optical module 200 and is electrically connected to a plurality of components, including the emitter 214 and the electrically conductive structure 230. The driver 220 may require a plurality of logic connections and/or multiple embedded layers of electrical routing (e.g., Copper routing) to communicate with other components of the optical module 200 and/or components of an electronic device (not shown) into which the optical module 200 is incorporated. The driver 220 includes a relatively large number (or high density) of ingoing and outgoing electrical connections (e.g. wiring 234 and/or vias 236). The second substrate 216 is configured to house the high density of electrical connections associated with the driver 220. In addition, the second substrate 216 may support other components (such as the detector 222) which includes further electrical connections to other components (e.g., an external power supply (not shown) and/or an external processor (not shown)). The detector 222 may be electrically connected to the driver 220 through electrical connections (e.g. via 238) that run through the second substrate 216

The first substrate 212 and the second substrate 216 differ from each other in order to perform their separate functions of thermal management and high-density electrical routing. The first substrate 212 has a greater thermal conductivity than the second substrate 216. For example, the first substrate 212 may comprise a ceramic, such as AlN or AlO2, whereas the second substrate 216 may comprise an electrically insulating material, such as FR4, having a lower thermal conductivity than the ceramic. The first substrate 212 may comprise a metallic frame, which may be referred to as a lead frame. The metallic frame may comprise an alloy comprising iron and nickel. The alloy may comprise about 42% nickel.

The second substrate 216 may house a plurality of electronic connections (e.g. power supplies, vias, logic connections, multiple embedded layers of Copper routing, etc.) that are used to operate the driver 220. The second substrate 216 is better suited to housing high densities of electrical connections compared to the first substrate 212. For example, the second substrate 216 may be configured to house a plurality of layers of electrical routing (e.g. between two and twelve embedded Copper layers). The first substrate 212 may be configured to support a single electrically conductive path on a surface of the ceramic to electrically connect the emitter 214 to the driver 220. For example, the electrically conductive path may connect to a via 236 of the driver 220 that travels through the second substrate 216.

The driver 220 generates thermal energy when in use. The driver 220 may become damaged, less efficient or non-operational if the driver 220 becomes too hot. The second substrate 216 may house a thermally conductive path 240 (e.g., a metallic connection, such as a via) that travels from the driver 220 to the first substrate 212. Heat energy generated by the driver 220 is transported away from the driver 220 and towards the first substrate 212 by the thermally conductive path 240. The thermally conductive path 240 and the first substrate 212 may therefore act as a heat sink for the driver 220. The thermally conductive path 240 and the first substrate 212 thereby assist in preventing the driver 220 from becoming too hot, which in turn improves an efficiency of the driver 220 and reduces the risk of the driver 220 becoming damaged.

Stacked arrangements are avoided in known optical modules (e.g. the known optical module 100 of FIG. 1) because stacked arrangements effectively form layers of thermal insulation that contribute to components of the optical module (e.g. the emitter) overheating. However, referring again to FIG. 2, separating the functions of the first and second substrates 212, 216 allows the substrates 212, 216 to be arranged in a stacked arrangement without causing overheating of the components of the optical module 200. This advantageously reduces an area or footprint of the optical module 200 compared to known optical modules, thereby allowing the optical module 200 to be incorporated into smaller devices (e.g. mobile phones) compared to known optical modules. The second substrate 216 may be attached to the first substrate 212 by bonding and/or soldering pads 245. The first substrate 212 may be attached to another substrate or structure (not shown) by bonding and/or soldering pads 247. For example, the first substrate 212 may be attached to a printed circuit board of a mobile phone (not shown).

The optical module 200 may have a length of about 3.0 mm or more. The optical module 200 may have a length of about 6.0 mm or less. The optical module 200 may have a width of about 2.0 mm or more. The optical module 200 may have a width of about 4.5 mm or less. The optical module 200 may have a height of about 1.0 mm or more. The optical module 200 may have a height of about 4.0 mm or less.

Figure 3:
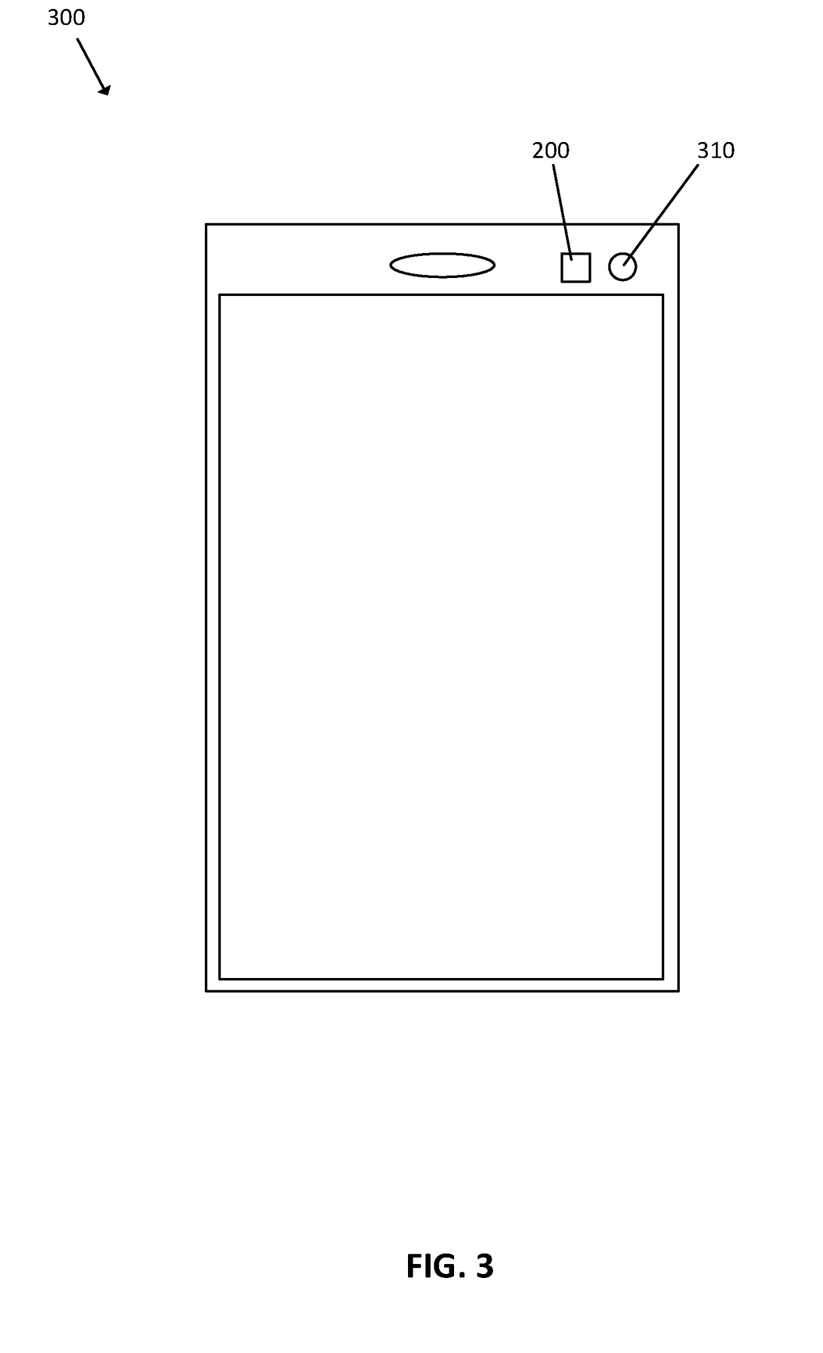
FIG. 3 schematically depicts an electronic device comprising the optical module of FIG. 2.

FIG. 3 schematically depicts an electronic device 300 comprising the optical module 200 of FIG. 2. In the example of FIG. 3, the electronic 300 device is a mobile phone. The optical module 200 may be configured to act as a miniature illuminator for the mobile phone 300. The optical module 200 may be configured to, for example, illuminate a wide area with very short pulses for Light Detection and Ranging (LIDAR) type measurements recording time of flight information. Alternatively, the optical module 200 may be configured to project a structured light pattern onto a scene, and a digital camera 310 of the electronic device 300 may be configured to record an image of the structured light pattern. Software algorithms stored in the electronic device 300 may then be used to determine three-dimensional scene information from modifications in the patterned image, e.g. three dimensional images, sense motion and/or gestures.

The optical module 200 may be incorporated into other kinds of electronic devices. For example, the optical module 200 may be incorporated into a telecommunications system, a tablet computer, a medical device such as a diagnostics device, etc.

Figure 4:
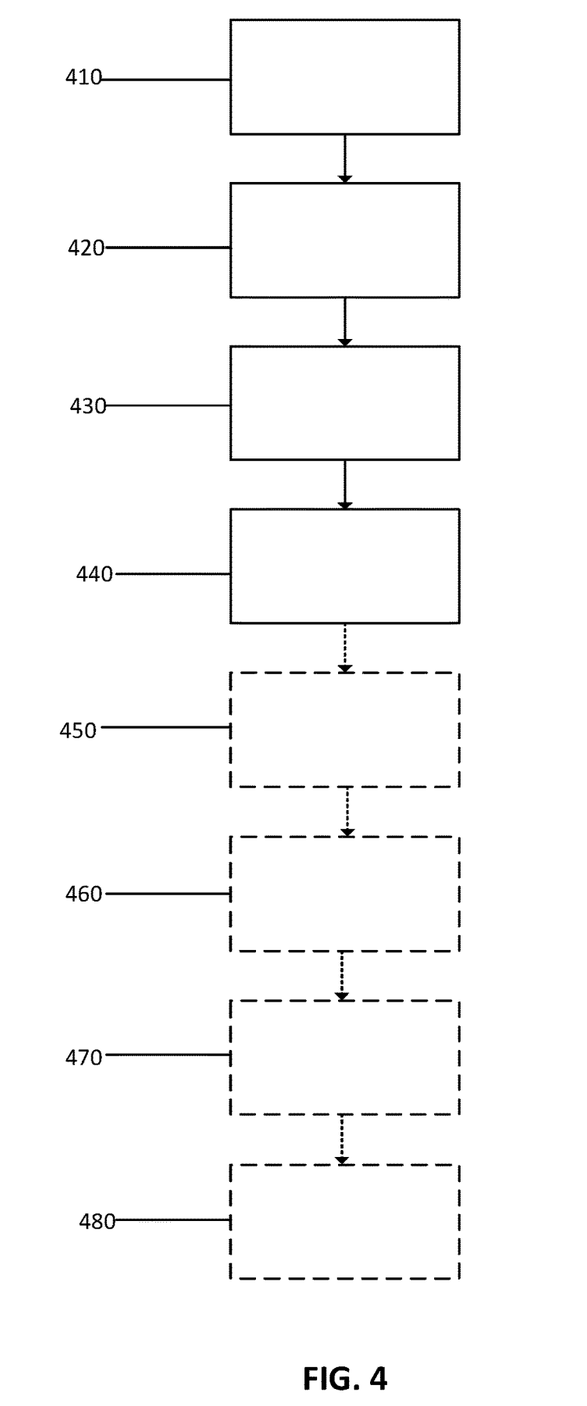
FIG. 4 shows a flow chart of a method of manufacturing an optical module according to an aspect of the present disclosure.

FIG. 4 shows a flow chart of a method of manufacturing an optical module. A first step 410 of the method comprises providing a first substrate. The first substrate may comprise a ceramic or a metallic frame.

A second step 420 comprises attaching an emitter to the first substrate. The second step 420 may comprise soldering the emitter to the first substrate.

A third step 430 comprises providing a second substrate having a thermal conductivity that is less than a thermal conductivity of the first substrate. The second substrate may comprise an electrically insulating material, such as FR4, configured to house a plurality of electrical connections (e.g. multiple embedded layers of Copper).

A fourth step 440 comprises attaching a driver to the second substrate. The driver is configured to control the emitter. The fourth step 440 may comprise soldering the driver to the second substrate.

An optional fifth step 450 comprises attaching a detector to the second substrate. The detector may be configured to detect back reflectance within the optical module. The optional fifth step 450 may comprise soldering the detector to the second substrate.

An optional sixth step 460 comprises attaching the second substrate to the first substrate. The optional sixth step 460 may comprise forming an electrical connection and/or a thermal connection between the first substrate and the second substrate. The optional sixth step 460 may comprise gluing the second substrate to the first substrate. The glue may comprise electrically conductive glue. The optional sixth step 460 may comprise soldering the second substrate to the first substrate.

An optional seventh step 470 comprises attaching a spacer to the second substrate. The spacer may comprise wiring. The optional seventh step 470 may comprise forming an electrical connection between the driver and the wiring on the spacer. The optional seventh step 470 may comprise gluing the spacer to the second substrate. The glue may comprise electrically conductive glue. The optional seventh step 470 may comprise soldering the wiring of the spacer to the driver.

An optional eighth step 480 comprises attaching an optical assembly to the spacer. The optical assembly may comprise an electrically conductive structure. The optional eighth step 480 may comprise forming an electrical connection between the electrically conductive structure of the optical assembly and the wiring on the spacer. The optional eight step may form an electrically conductive path between the electrically conductive structure and the driver. The optional eighth step 480 may comprise gluing the optical assembly to the spacer. The glue may comprise electrically conductive glue. The optional eighth step 480 may comprise soldering the electrically conductive structure of the optical assembly to the wiring of the spacer.

LIST OF REFERENCE NUMERALS 100 known optical module
120 printed circuit board
130 emitter
134 wiring
140 driver
150 detector
160 optical assembly
170 transmissive carrier
180 optical element
190 spacers
200 optical module
212 first substrate
214 emitter
216 second substrate
218 opening
220 driver
222 detector
224 optical assembly
226 transmissive carrier
228 optical element
230 electrically conductive structure
232 spacers
234 wiring
236 driver via
238 detector via
240 thermally conductive path
245 second substrate soldering pads
247 first substrate soldering pads
300 electronic device
310 camera
410 first step
420 second step
430 third step
440 fourth step
450 optional fifth step
460 optional sixth step
470 optional seventh step
480 optional eighth step The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure that are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. An optical module comprising:
   an emitter configured to emit electromagnetic radiation;
   a first substrate configured to support the emitter;
   a driver configured to control the emitter;
   a second substrate configured to support the driver, wherein the first substrate has a greater thermal conductivity than the second substrate; and
   an optical assembly configured to modify an optical characteristic of the electromagnetic radiation,
   wherein the optical assembly comprises an electrically conductive structure electrically coupled to the driver, and wherein the driver is configured to monitor an electrical characteristic of the electrically conductive structure.

2. The optical module of claim 1, wherein the driver is configured to regulate an optical output of the emitter if the electrical characteristic of the electrically conductive structure changes by more than a pre-determined amount.

3. The optical module of claim 2, wherein the driver is configured to stop the optical output of the emitter if the electrical characteristic of the electrically conductive structure changes by more than the pre-determined amount.

4. The optical module of claim 1, wherein the electrically conductive structure and the emitter are arranged such that the electromagnetic radiation is at least partially incident on the electrically conductive structure, and wherein the electrically conductive structure is substantially transparent to the electromagnetic radiation.

5. The optical module of claim 1, wherein the electrically conductive structure and the emitter are arranged such that the electromagnetic radiation is not incident on the electrically conductive structure, and wherein the electrically conductive structure is substantially opaque to the electromagnetic radiation.

6. The optical module of claim 1, comprising a spacer configured to define a separation distance between the second substrate and the optical assembly.

7. A method of manufacturing an optical module comprising:
   providing a first substrate configured to support an emitter configured to emit electromagnetic radiation;
   attaching the emitter to a first surface of the first substrate;
   providing a second substrate configured to support a driver configured to control the emitter,
   wherein the first substrate has a greater thermal conductivity than the second substrate;
   attaching the driver to a first surface of the second substrate;
   attaching a spacer configured to define a separation distance between the second substrate and an optical assembly; and
   attaching the optical assembly configured to modify an optical characteristic of the electromagnetic radiation,
   wherein the optical assembly comprises an electrically conductive structure electrically coupled to the driver, and wherein the driver is configured to monitor an electrical characteristic of the electrically conductive structure.

8. The method of claim 7, wherein the driver is configured to regulate an optical output of the emitter if the electrical characteristic of the electrically conductive structure changes by more than a pre-determined amount.

9. The method of claim 8, wherein the driver is configured to stop the optical output of the emitter if the electrical characteristic of the electrically conductive structure changes by more than the pre-determined amount.

10. The method of claim 7, wherein the electrically conductive structure and the emitter are arranged such that the electromagnetic radiation is at least partially incident on the electrically conductive structure, and wherein the electrically conductive structure is substantially transparent to the electromagnetic radiation.

11. The method of claim 7, wherein the electrically conductive structure and the emitter are arranged such that the electromagnetic radiation is not incident on the electrically conductive structure, and wherein the electrically conductive structure is substantially opaque to the electromagnetic radiation.

\* \* \* \* \*